United States Patent
Donlan

(10) Patent No.: US 9,489,252 B1
(45) Date of Patent: Nov. 8, 2016

(54) FILE RECOVERY USING DIVERSE ERASURE ENCODED FRAGMENTS

(71) Applicant: Amazon Technologies, Inc., Reno, NV (US)

(72) Inventor: Bryan James Donlan, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 185 days.

(21) Appl. No.: 14/274,218

(22) Filed: May 9, 2014

Related U.S. Application Data

(60) Provisional application No. 61/902,029, filed on Nov. 8, 2013.

(51) Int. Cl.
| | |
|---|---|
| *G06F 11/08* | (2006.01) |
| *H03M 13/37* | (2006.01) |
| *H03M 13/15* | (2006.01) |
| *H03M 13/01* | (2006.01) |
| *H03M 13/00* | (2006.01) |
| *G06F 12/02* | (2006.01) |

(52) U.S. Cl.
CPC ......... *G06F 11/085* (2013.01); *G06F 12/0238* (2013.01); *H03M 13/015* (2013.01); *H03M 13/1515* (2013.01); *H03M 13/373* (2013.01); *H03M 13/616* (2013.01); *G06F 2211/109* (2013.01)

(58) Field of Classification Search
CPC ............. G06F 11/085; G06F 12/0238; G06F 2211/109; H03M 13/1515; H03M 13/373; H03M 13/015; H03M 13/616
USPC ....... 714/766, 763, 768, 752, 755, 758, 773, 714/784, 786, 6.24
See application file for complete search history.

(56) References Cited

U.S. PATENT DOCUMENTS

| | | | |
|---|---|---|---|
| 6,738,380 B1 | 5/2004 | Imai et al. | |
| 7,581,156 B2 * | 8/2009 | Manasse | H03M 13/1515 714/781 |
| 8,250,433 B2 * | 8/2012 | Wylie | H03M 13/015 714/758 |

(Continued)

OTHER PUBLICATIONS

Yanfei Fan, Network Coding based Information Security in Multi-hop Wireless Networks, 2010, University of Waterloo, pp. 1-98.*

(Continued)

*Primary Examiner* — John J Tabone, Jr.
(74) *Attorney, Agent, or Firm* — Lee and Hayes, PLLC; Charles L. Warner

(57) ABSTRACT

Diverse erasure encoded fragments, that is, fragments produced by different erasure encoding schemes, may be used to reconstruct a data file. The diverse erasure encoded fragments for the data file are collected and the erasure encoding schemes used to generate the fragments are identified. A fragment matrix is generated from these fragments. An expanded encoding matrix is generated based upon the identified erasure encoding schemes. One or more rows may be removed from the expanded matrix to generate a square matrix. If the square matrix is invertible then it is inverted to provide a decoding matrix. One or more corresponding rows may be removed from the collected fragment matrix. The decoding matrix and the collected fragment matrix are multiplied to recover the data file. Padding symbols may be added to one or more fragments so that all fragments have the same number of symbols per fragment.

21 Claims, 6 Drawing Sheets

(56) References Cited

U.S. PATENT DOCUMENTS

| | | | |
|---|---|---|---|
| 8,418,029 | B2 | 4/2013 | Daikokuya |
| 8,429,503 | B2 | 4/2013 | Okamura et al. |
| 8,473,778 | B2* | 6/2013 | Simitci ............... H03M 13/373 714/6.2 |
| 8,504,535 | B1 | 8/2013 | He et al. |
| 8,522,109 | B2 | 8/2013 | Murakami et al. |
| 8,706,980 | B2 | 4/2014 | Dhuse et al. |
| 8,751,894 | B2* | 6/2014 | Grube .......................... 714/755 |
| 8,806,296 | B1 | 8/2014 | Lazier |
| 8,850,288 | B1 | 9/2014 | Lazier et al. |
| 8,869,001 | B1 | 10/2014 | Lazier |
| 8,928,503 | B2 | 1/2015 | Oggier et al. |
| 9,026,867 | B1 | 5/2015 | Northcott et al. |
| 9,098,446 | B1 | 8/2015 | Donlan et al. |
| 9,098,447 | B1 | 8/2015 | Donlan et al. |
| 9,158,927 | B1* | 10/2015 | Franklin ............... G06F 21/602 |
| 9,229,810 | B2 | 1/2016 | He et al. |
| 2004/0078746 | A1 | 4/2004 | Tanaka et al. |
| 2004/0117718 | A1* | 6/2004 | Manasse ........... H03M 13/1515 714/781 |
| 2004/0225946 | A1 | 11/2004 | Hashimoto et al. |
| 2006/0080574 | A1 | 4/2006 | Saito et al. |
| 2006/0155946 | A1 | 7/2006 | Ji |
| 2006/0184857 | A1 | 8/2006 | Takagi et al. |
| 2006/0212782 | A1* | 9/2006 | Li ..................... H03M 13/1575 714/784 |
| 2007/0011582 | A1 | 1/2007 | Moriyama et al. |
| 2008/0221856 | A1 | 9/2008 | Dubnicki et al. |
| 2009/0222585 | A1 | 9/2009 | Khalil et al. |
| 2010/0083068 | A1* | 4/2010 | Wylie ................. H03M 13/015 714/752 |
| 2010/0094986 | A1 | 4/2010 | Zuckerman et al. |
| 2010/0095012 | A1 | 4/2010 | Zuckerman et al. |
| 2010/0095184 | A1 | 4/2010 | Zuckerman et al. |
| 2010/0100587 | A1 | 4/2010 | Teglovic et al. |
| 2010/0174968 | A1 | 7/2010 | Charles et al. |
| 2011/0029711 | A1 | 2/2011 | Dhuse et al. |
| 2011/0029742 | A1 | 2/2011 | Grube et al. |
| 2011/0029809 | A1 | 2/2011 | Dhuse et al. |
| 2011/0087948 | A1 | 4/2011 | Murakami et al. |
| 2011/0197106 | A1 | 8/2011 | Kishigami et al. |
| 2012/0278679 | A1 | 11/2012 | Rub et al. |
| 2013/0061116 | A1 | 3/2013 | Grube et al. |
| 2013/0173956 | A1* | 7/2013 | Anderson ........... G06F 11/1076 714/6.24 |
| 2013/0204849 | A1 | 8/2013 | Chacko |
| 2014/0129904 | A1 | 5/2014 | Sakai et al. |
| 2014/0344531 | A1 | 11/2014 | Lazier |
| 2015/0378820 | A1* | 12/2015 | Doerner .............. G06F 11/1076 714/766 |
| 2016/0013815 | A1* | 1/2016 | Wideman ............ G06F 11/1453 714/766 |

OTHER PUBLICATIONS

Sunitha et al. Ensuring Availability and Integrity of Data Storage in Cloud Computing, Feb. 2013, Paripex—Indian Journal of Research, vol. 2, Issue: 2, pp. 119-122.*

Awassada Phutathum, Implementing Distributed Storage Systems by Network Coding and Considering Complexity of Decoding, Aug. 20, 2012, KTH Electrical Engineering, pp. 1-51.*

Lacan et al., Systematic MDS Erasure Codes Based on Vandermonde Matrices, Sep. 2004, IEEE, vol. 8, No. 9, pp. 570-572.*

Tang et al., A Sub-Matrix Method for Multiple Reed-Solomon Erasure Coding, 2007, IEEE, pp. 166-170.*

Normand, Erasure Coding with the Finite Radon Transform, 2010, IEEE, pp. 1-6.*

Courtade et al., Optimal Allocation of Redundancy Between Packet-Level Erasure Coding and Physical-Layer Channel Coding in Fading Channels, Aug. 2011, IEEE, vol. 59, No. 8, pp. 2101-2109.*

U.S. Appl. No. 13/898,066, filed May 20, 2013, Donlan et al.

U.S. Appl. No. 13/898,071, filed May 20, 2013, Donlan et al.

Huang, C. et al., "Erasure Coding in Windows Azure Storage", Microsoft Corporation [online][retrieved on: May 22, 2013] retrieved from: http://research.microsoft.com/pubs/179583/LRC12-cheng%20webpage.pdf, 12.

Weatherspoon, H. et al., "Erasure Coding vs. Replication: A Quantitative Comparison", Computer Science Division, University of California, Berkeley [online][retrieved on: May 22, 2013] retrieved from: http://www.cs.rice.edu/Conferences/IPTPS02/170,pdf, 6 pps.

Hendricks, J. et al., "Verifying Distributed Erasure-Coded Data", PODS 2007, Aug. 12-15, 2007, Portland, Oregon, US [online][retrieved on: May 22, 2013] retrieved from: http://www.pdl.cmu.edu/PDL-FTP/SelfStar/podc07.pdf, 8 pps.

U.S. Appl. No. 13/925,497, filed Jun. 24, 2013.

Hendricks, Efficient Byzantine Fault Tolerance for Scalable Storage and Services, Jul. 2009, School of Computer Science Carnegie Mellon University Pittsburgh, PA 15213, 126 pages.

Luo et al. "An Efficient XOR-Scheduling Algorithm for Erasure Codes Encoding", Publisher: IEEE, published in Dependable Systems & Networks, 2009, IEEE/IFIP Int'l Conference, Lisbon, Jun. 29, 2009, pp. 504-513.

Nychis et al., Analysis of Erasure Coding in a Peer to Peer Backup System, May 2006, Carnegie Mellon University, pp. 1-13.

Office action for U.S. Appl. No. 13/898,071, mailed on Dec. 17, 2014, Donlan et al., "Recovery of Corrupted Erasure-Coded Data Files", 10 pages.

Office action for U.S. Appl. No. 13/898,066, mailed on Dec. 18, 2014, Donlan et al., "Recovery of Corrupted Erasure-Coded Data Files", 10 pages.

Office action for U.S. Appl. No. 13/925,497, mailed on Dec. 19, 2014, Franklin et al., "Cross-Region Recovery of Encrypted, Erasure-Encoded Data", 14 pages.

Office action for U.S. Appl. No. 14/500,576, mailed on Mar. 10, 2016, Franklin et al., "Verification of Erasure Encoded Fragments", 9 pages.

Office action for U.S. Appl. No. 14/307,313, mailed on Apr. 15, 2016, Donlan et al., "Generation and Verification of Erasure Encoded Fragments", 29 pages.

Office action for U.S. Appl. No. 14/500,582, mailed on Apr. 21, 2016, Frankilin et al., "Verification of Erasure Encoded Fragments", 21 pages.

* cited by examiner

FILE RECOVERY USING DIVERSE ERASURE ENCODED FRAGMENTS

CROSS-REFERENCE TO RELATED APPLICATION

This application claims the priority of U.S. Provisional Patent Application No. 61/902,029, filed Nov. 8, 2013, entitled "Data File Reconstruction Using Fragments From Different Erasure Encoding Schemes," the entire disclosure and contents of which are hereby incorporated by reference herein.

BACKGROUND

Erasure encoding breaks generates a mathematical construct of n "fragments" for a data file. When it is desired to reconstruct the data file, only m non-identical valid fragments of the n erasure encoded fragments produced by that erasure encoding scheme are required to accurately construct the original data file. It may happen, however, that there are not sufficient valid or recoverable fragments produced by a single erasure encoding scheme to allow recovery of the data file. It is with respect to this and other considerations that the disclosure presented herein has been made.

DETAILED DESCRIPTION

The following Detailed Description is directed to technologies for reconstruction of data files from erasure encoded fragments. It may be possible to reconstruct a data file using diverse erasure encoded fragments, that is, erasure encoded fragments produced by two or more different erasure encoding schemes, even when there are insufficient fragments to permit recovery using any one of the originally-used erasure encoding schemes by itself.

Figure 1:
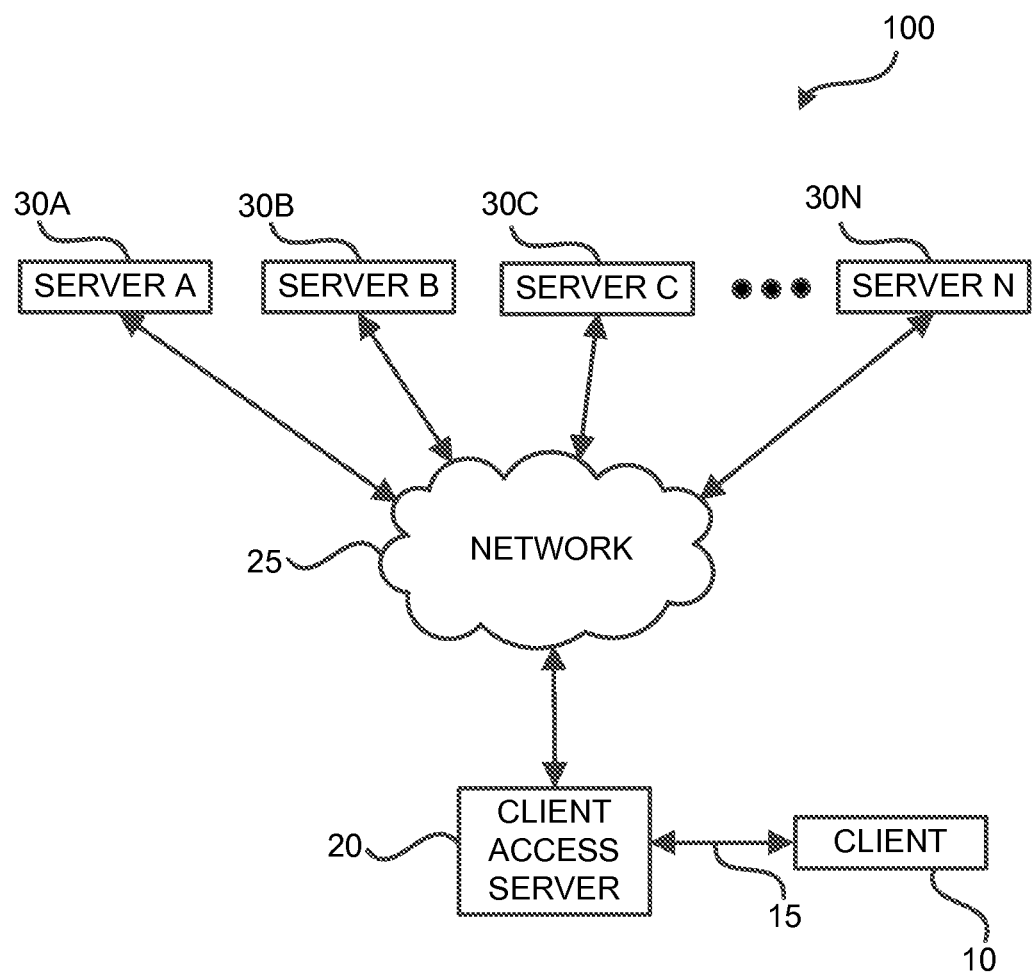
FIG. 1 is an illustration of exemplary distributed computing system that can receive, store, recover, and send data files based on erasure encoded data.

FIG. 1 is an illustration of exemplary distributed computing system 100 that can receive, store, recover, and send data files based on erasure encoded data. In the example system 100 shown in FIG. 1, a client has a data file D that the client wishes to have backed up at a location other than at the client site. In order to accomplish this, a client computer 10 connects with a client access server 20, client access gateway, or client access portal via a connection 15, and sends the data file to the client access server 20. Typically, a client would send multiple data files to the client access server 20 for storage. The connection 15 may be any desired connection or connections that provide the desired security, data speed, cost of service, etc., such as, but not limited to, the Internet. The network 25 is preferably a secure, internal data network but can be the Internet or any desired connection or connections that provide the desired security, data speed, cost of service, etc. The connection 15 and the network 25 may be the same or share one or more connections.

In response to receiving the data file D, the client access server 20 erasure encodes the data file using, for example, an m-of-n system such as those described above, and distributes the n fragments over a network 25 to a multitude of servers 30A-30N for storage. There could be only two servers 30 with each server storing m of the n fragments, n servers with each server storing one of the n fragments, more than n servers with some of the fragments being duplicated across two or more servers, or even k servers with each server storing n/k fragments, where n/k is not less than n-m.

Suppose now that the client computer 10 suffers a hard drive failure, from which the data file cannot be recovered, or suffers from some other event that destroys the data file on the client computer 10. The client will then use a client computer 10 to request that the client access server 20 retrieve and provide those stored data files to the client computer 10. For each data file, the client access server 20 will then request that the various servers 30 provide the fragments for that file to the client access server 20. The client access server 20 will then use the fragments to reconstruct the data file D. The client access server 20 will then send the reconstructed data file(s) to the client computer 10. Although the data file reconstruction is described herein as being performed by the client access server 20, the data file reconstruction can also be performed by any one or more of the servers 30A-30N, by the client computer 10, or by another computing device or devices.

In some cases, the stored fragments for a data file may have been generated only once, using a single erasure encoding scheme. In other cases, the stored fragments for a data file may have been generated more than once, but using the same erasure encoding scheme. In still other cases, the stored fragments for a data file may have been generated using two or more different erasure encoding schemes. As long as there are sufficient valid or recoverable erasure encoded fragments produced by a single erasure encoding scheme then the data file may be reconstructed. If there are not sufficient valid or recoverable erasure encoded fragments produced by a single erasure encoding scheme then, typically, the data file has been considered to be nonrecoverable. If, however, a data file has been stored more than once by using different erasure encoding schemes, or was originally stored using one erasure encoding scheme and has been converted to another erasure encoding scheme, then diverse erasure encoded fragments may be available, that is, fragments produced by different erasure encoding schemes. The system and process disclosed herein may allow recovery of the data file using these diverse fragments even if there are not sufficient valid or recoverable fragments produced by a single erasure encoding scheme to allow recovery of the data file by the corresponding decoding scheme.

The discussion herein with respect to FIGS. 1-4 enables any person skilled in the art to reconstruct a data file using diverse erasure encoded fragments. It is recommended, however, that the viewer also read the discussion of erasure encoding and decoding operations immediately below.

For simplicity and ease of illustration, first consider a data file D. A data file is actually a one-dimensional array but, once the encoding scheme is determined, the data file may be considered to a one-column matrix where the rows (the break points in the data) are determined by the particular encoding scheme used For example, even though must files are large files, and encoding operations operate on large numbers of bits at once, assume for simplicity of discussion that D is a 64 bit file, and the coefficient (A) in the erasure encoding scheme operates on 16 bits at a time then one may consider the data file to be, $$D = \begin{bmatrix} D_0 \\ D_1 \\ D_2 \\ D_3 \end{bmatrix}.$$

The erasure coding scheme is then applied once for $D_0$ and $D_1$, and a second time for $D_2$ and $D_3$. If D is longer, then the erasure coding scheme would also be applied additional times, to $D_4$, $D_5$, $D_6$, etc.).

Assume now that a first erasure encoding scheme k=2, having an encoding matrix A, and a fragment length of L symbols:

$$\begin{bmatrix} A_{0,0} & A_{0,1} \\ A_{1,0} & A_{1,1} \end{bmatrix}$$

is applied to the data file D, the result will be two sets of erasure encoded fragments $$CA0 = \begin{bmatrix} C_{A,0,0} \\ C_{A,0,1} \end{bmatrix},$$

and $$CA1 = \begin{bmatrix} C_{A,1,0} \\ C_{A,1,1} \end{bmatrix},$$

where $$C_{A,0,0} = A_{0,0} D_0 + A_{0,1} D_1$$

$$C_{A,0,1} = A_{1,0} D_0 + A_{1,1} D_1$$

$$C_{A,1,0} = A_{0,0} D_2 + A_{0,1} D_3$$

$$C_{A,1,1} = A_{1,0} D_2 + A_{1,1} D_3$$

As long as a certain number of fragments CA is available then the data file D can be reconstructed using the fragments CA and the inverse of the coding matrix A.

$$\begin{bmatrix} A_{0,0} & A_{0,1} \\ A_{1,0} & A_{1,1} \end{bmatrix}^{-1} \cdot \begin{bmatrix} C_{A,0,0} \\ C_{A,0,1} \end{bmatrix} = \begin{bmatrix} D_0 \\ D_1 \end{bmatrix},$$

and $$\begin{bmatrix} A_{0,0} & A_{0,1} \\ A_{1,0} & A_{1,1} \end{bmatrix}^{-1} \cdot \begin{bmatrix} C_{A,1,0} \\ C_{A,1,1} \end{bmatrix} = \begin{bmatrix} D_2 \\ D_3 \end{bmatrix}.$$

Now consider a second erasure encoding scheme k=4, having an encoding matrix B, and having the same fragment length, L symbols:

$$\begin{bmatrix} B_{0,0} & B_{0,1} & B_{0,2} & B_{0,3} \\ B_{1,0} & B_{1,1} & B_{1,2} & B_{1,3} \\ B_{2,0} & B_{2,1} & B_{2,2} & B_{2,3} \\ B_{3,0} & B_{3,1} & B_{3,2} & B_{3,3} \end{bmatrix}.$$

The result of applying the second erasure encoding scheme to the same data file D will be a second set of erasure encoded fragments $$CB = \begin{bmatrix} C_{B,0,0} \\ C_{B,0,1} \\ C_{B,1,0} \\ C_{B,1,1} \end{bmatrix},$$

where $$C_{B,0,0} = B_{0,0} D_0 + B_{0,1} D_1 + B_{0,2} D_2 + B_{0,3} D_3,$$

$$C_{B,0,1} = B_{1,0} D_0 + B_{1,1} D_1 + \ldots, \text{etc.}$$

Also, as long as a certain number of fragments CB is available then the data file D can be reconstructed.

$$\begin{bmatrix} B_{0,0} & B_{0,1} & B_{0,2} & B_{0,3} \\ B_{1,0} & B_{1,1} & B_{1,2} & B_{1,3} \\ B_{2,0} & B_{2,1} & B_{2,2} & B_{2,3} \\ B_{3,0} & B_{3,1} & B_{3,2} & B_{3,3} \end{bmatrix}^{-1} \cdot \begin{bmatrix} C_{B,0,0} \\ C_{B,0,1} \\ C_{B,1,0} \\ C_{B,1,1} \end{bmatrix} = \begin{bmatrix} D_0 \\ D_1 \\ D_2 \\ D_3 \end{bmatrix}$$

A problem may arise, however, wherein a data file D has been encoded using two different erasure encoding schemes, such as illustrated above, but there are neither enough CA fragments to reconstruct the data file using the first erasure encoding scheme nor enough CB fragments to reconstruct the data file using the second erasure encoding scheme. Previously, in that situation, the data file D was considered not to be recoverable. As disclosed herein, however, the data file D may still be recoverable from a combination of the disparate sets of fragments.

Let us now consider a hypothetical composite encoding matrix MEC, formed from portions of the A and B matrices. Note that the matrix A only has two columns, whereas the matrix B has 4 columns, so zeroes are added to a row from the matrix A to make a row for the matrix MEC which has four columns.

$$MEC = \begin{bmatrix} A_{0,0} & A_{0,1} & 0 & 0 \\ 0 & 0 & A_{0,0} & A_{0,1} \\ B_{0,0} & B_{0,1} & B_{0,2} & B_{0,3} \\ B_{1,0} & B_{1,1} & B_{1,2} & B_{1,3} \end{bmatrix}$$

If the matrix MEC is applied to the data file D, the resulting composite fragments are:

$$\begin{bmatrix} C_{A,0,0} \\ C_{A,1,0} \\ C_{B,0,0} \\ C_{B,0,1} \end{bmatrix} = \begin{bmatrix} A_{0,0} & A_{0,1} & 0 & 0 \\ 0 & 0 & A_{0,0} & A_{0,1} \\ B_{0,0} & B_{0,1} & B_{0,2} & B_{0,3} \\ B_{1,0} & B_{1,1} & B_{1,2} & B_{1,3} \end{bmatrix} \cdot \begin{bmatrix} D_0 \\ D_1 \\ D_2 \\ D_3 \end{bmatrix}$$

It therefore follows, by multiplying both sides of the equation by the inverse of MEC, that $$\begin{bmatrix} A_{0,0} & A_{0,1} & 0 & 0 \\ 0 & 0 & A_{0,0} & A_{0,1} \\ B_{0,0} & B_{0,1} & B_{0,2} & B_{0,3} \\ B_{1,0} & B_{1,1} & B_{1,2} & B_{1,3} \end{bmatrix}^{-1} \cdot \begin{bmatrix} C_{A,0,0} \\ C_{A,1,0} \\ C_{B,0,0} \\ C_{B,0,1} \end{bmatrix} = \begin{bmatrix} D_0 \\ D_1 \\ D_2 \\ D_3 \end{bmatrix}$$

Similarly, using a different set of matrix components for the matrix MEC, $$\begin{bmatrix} C_{A,0,1} \\ C_{A,1,1} \\ C_{B,0,0} \\ C_{B,0,1} \end{bmatrix} = \begin{bmatrix} A_{1,0} & A_{1,1} & 0 & 0 \\ 0 & 0 & A_{1,0} & A_{1,1} \\ B_{0,0} & B_{0,1} & B_{0,2} & B_{0,3} \\ B_{1,0} & B_{1,1} & B_{1,2} & B_{1,3} \end{bmatrix} \cdot \begin{bmatrix} D_0 \\ D_1 \\ D_2 \\ D_3 \end{bmatrix},$$

it therefore again follows, by multiplying both sides of the equation by the inverse of MEC, that $$\begin{bmatrix} D_0 \\ D_1 \\ D_2 \\ D_3 \end{bmatrix} = \begin{bmatrix} A_{1,0} & A_{1,1} & 0 & 0 \\ 0 & 0 & A_{1,0} & A_{1,1} \\ B_{0,0} & B_{0,1} & B_{0,2} & B_{0,3} \\ B_{1,0} & B_{1,1} & B_{1,2} & B_{1,3} \end{bmatrix}^{-1} \cdot \begin{bmatrix} C_{A,0,1} \\ C_{A,1,1} \\ C_{B,0,0} \\ C_{B,0,1} \end{bmatrix}$$

As another example, using a different set of matrix components for the matrix MEC, $$\begin{bmatrix} C_{A,0,1} \\ C_{B,0,0} \\ C_{B,0,1} \\ C_{B,1,0} \end{bmatrix} = \begin{bmatrix} A_{1,0} & A_{1,1} & 0 & 0 \\ B_{0,0} & B_{0,1} & B_{0,2} & B_{0,3} \\ B_{1,0} & B_{1,1} & B_{1,2} & B_{1,3} \\ B_{2,0} & B_{2,1} & B_{2,2} & B_{2,3} \end{bmatrix} \cdot \begin{bmatrix} D_0 \\ D_1 \\ D_2 \\ D_3 \end{bmatrix},$$

it therefore again follows, by multiplying both sides of the equation by the inverse of MEC, that $$\begin{bmatrix} A_{1,0} & A_{1,1} & 0 & 0 \\ B_{0,0} & B_{0,1} & B_{0,2} & B_{0,3} \\ B_{1,0} & B_{1,1} & B_{1,2} & B_{1,3} \\ B_{2,0} & B_{2,1} & B_{2,2} & B_{2,3} \end{bmatrix}^{-1} \cdot \begin{bmatrix} C_{A,0,1} \\ C_{B,0,0} \\ C_{B,0,1} \\ C_{B,1,0} \end{bmatrix} = \begin{bmatrix} D_0 \\ D_1 \\ D_2 \\ D_3 \end{bmatrix}$$

Thus, if the selected composite encoding matrix MEC is invertible then the data file may be recoverable using fragments generated by different encoding schemes.

In the example given, it was assumed that four fragments were recovered so the selected composite encoding matrix MEC is a 4×4 matrix. It may happen that more than four fragments may be recovered, and it may even happen that some fragments are identical fragments. It should be noted that, in the decoding matrix MD discussed below, if any two or more rows in the decoding matrix are identical then that decoding matrix will not be invertible. Therefore, duplicate fragments are discarded so that the expanded encoding matrix does not have any duplicate rows.

As an example, assume that, after eliminating any duplicate fragments, five fragments are recovered: $C_{A,0,0}$, $C_{A,0,1}$, $C_{B,0,0}$, $C_{B,0,1}$, and $C_{B,1,0}$.

The collected fragments matrix (CD) is therefore $$\begin{bmatrix} C_{A,0,0} \\ C_{A,0,1} \\ C_{B,0,0} \\ C_{B,0,1} \\ C_{B,1,0} \end{bmatrix}.$$

A fragment, metadata associated with the fragment, or separately-stored data regarding the fragment, contains information regarding, or will specify, the particular erasure encoding scheme used, which will also provide information regarding the length L of the fragment. In this case, based upon those identified erasure encoding schemes, an expanded encoding matrix (EEM) which could have produced these fragments may be:

$$\begin{bmatrix} A_{0,0} & A_{0,1} & 0 & 0 \\ A_{1,0} & A_{1,1} & 0 & 0 \\ B_{0,0} & B_{0,1} & B_{0,2} & B_{0,3} \\ B_{1,0} & B_{1,1} & B_{1,2} & B_{1,3} \\ B_{2,0} & B_{2,1} & B_{2,2} & B_{2,3} \end{bmatrix}.$$

It will be appreciated that this expanded encoding matrix is not invertible and, further, the expanded coding matrix (5 rows, 4 columns, that is, a 5×4 matrix) and the collected fragments matrix (5 rows, 1 column, that is, a 5×1 matrix) are not of the proper dimensions to permit matrix multiplication. Therefore, one or more of the rows in this expanded encoding matrix is selected and eliminated ("pruned") to provide a first decoding matrix $MD_1$, a square matrix, which is a 4×4 matrix in this example, and therefore may be (or may not be) invertible. If the square decoding matrix $MD_1$ produced by the pruning is invertible then a corresponding row or rows of the collected fragments matrix is eliminated to provide a pruned collected fragment matrix $CD_1$, which has a first set of erasure encoded fragments. In this case, the pruned collected fragment matrix $CD_1$ will be a 4×1 matrix. The dimensions of these matrices will then permit inversion and multiplication. Decoding may then be performed using $MD_1$ and $CD_1$.

For example, assume that the second row of matrix MR and the second row of matrix MD are removed to provide matrices $MD_1$ and $CD_1$. Matrix $MD_1$ is then inverted (if possible). The inverted matrix $MD_1$ and the pruned collected fragment matrix $CD_1$ are then multiplied to solve for the data file D as:

$$\begin{bmatrix} D_0 \\ D_1 \\ D_2 \\ D_3 \end{bmatrix} = \begin{bmatrix} A_{0,0} & A_{0,1} & 0 & 0 \\ B_{0,0} & B_{0,1} & B_{0,2} & B_{0,3} \\ B_{1,0} & B_{1,1} & B_{1,2} & B_{1,3} \\ B_{2,0} & B_{2,1} & B_{2,2} & B_{2,3} \end{bmatrix}^{-1} \cdot \begin{bmatrix} C_{A,0,0} \\ C_{B,0,0} \\ C_{B,0,1} \\ C_{B,1,0} \end{bmatrix}$$

If the resulting decoding matrix $MD_1$ is not invertible then a different row in the expanded encoding matrix EEM is selected and eliminated, along with the corresponding row of the collected fragments matrix CD, to provide a second decoding matrix $MD_2$ and a second set of erasure encoded fragments $CD_2$. If matrix $MD_2$ is invertible then decoding is performed using $MD_2$ and $CD_2$ to recover the data file. If the resulting decoding matrix is not invertible then a different row is deleted, invertibility is tested, and so on, until an invertible matrix is created or all possible combinations have been exhausted.

The fragment selection determines the coefficients used in the decoding matrix. For example, if fragment $C_{A,0,0}$ is available then, as it was generated using $A_{0,0}$ and $A_{0,1}$, along with $D_0$ and $D_1$, then $A_{0,0}$ and $A_{0,1}$ will be on the left side of the row. Similarly, if fragment $C_{A,1,1}$ is available then, as it was generated using $A_{1,0}$ and $A_{1,1}$, along with $D_2$ and $D_3$, then $A_{1,0}$ and $A_{1,1}$ will be positioned in the third and fourth positions in a row, corresponding to the third and fourth positions of $D_2$ and $D_3$ in the data file. The row position is not a factor. For example, if the fragment $C_{A,0,0}$ is available then $C_{A,0,0}$, $A_{0,0}$ and $A_{0,1}$ may be in the first row, the second row, the last row, etc., as long as they are in the same row.

Thus, fragments are recovered and an expanded or enhanced encoding matrix is generated based upon those fragments, the coefficients in the expanded encoding matrix being determined by the coefficients used to generate the recovered fragments. The expanded encoding matrix is then pruned by removing one or more rows to produce a square matrix. If the matrix is invertible then the fragment matrix is similarly pruned, and then multiplied by the inverted, pruned encoding matrix to recover the data file. If unsuccessful, then the expanded encoding matrix is pruned by removing a different row or rows, and the process is repeated until the data file is recovered or all possible combinations have been exhausted. Verification that the data file has been recovered may be performed by any desired technique. For example, the recovered data file may be re-encoded using the same erasure encoding schemes used in the original encoding schemes to determine whether the newly-produced fragments are the same as the recovered fragments.

It is not necessary that all of the fragments be retrieved before beginning the procedure. If the expanded encoding matrix EEM has, for example, 4 columns then the process may be started by retrieving just four fragments to generate a set of fragments, generating a corresponding encoding matrix, inverting it, and multiplying it with those four fragments. If unsuccessful, then another fragment could be retrieved, used to replace one of the previous fragments, a corresponding encoding matrix is generated and inverted, and that is multiplied with a set of fragments which includes the replacement fragment replacing one of the original fragments. If unsuccessful, that replacement fragment may be used to replace a different fragment, a corresponding encoding matrix is generated and inverted, and that is multiplied with the new set of fragments which includes the replacement fragment replacing a different original fragment. If unsuccessful, then still another fragment could be retrieved, used to replace one of the previous original or replacement fragments to generate a new set of fragments, a corresponding encoding matrix is generated and inverted, and that is multiplied with this new set of fragments. This process may be repeated until successful or until all fragments have been retrieved and/or tried in all possible combinations.

The above discussions assumed that the fragments had the same number of symbols, also referred to herein as the fragment length (L), even though they were generated by different erasure encoding schemes. It may happen, however, that the different erasure encoding schemes which were used produced fragments which had different lengths, that is, different numbers of symbols. To accommodate that situation, the fragments may be extended so that they are the same length, that length also being exactly divisible by the orders of the different erasure encoding schemes used. The fragments are preferably extended by adding padding characters (padding symbols). The padding characters must be the same as those used in the erasure encoding process and must be the same for all of the erasure codes used. Typically, zeroes are used for padding.

The "order" of an "m-of-n" erasure encoding scheme, as used herein, is the number of columns in the erasure encoding matrix, that is, "m". This also corresponds to the minimum number of fragments needed to reconstruct the original data using conventional techniques. This may also be considered to be the order of the fragment. For example, assume that a first erasure encoding scheme has an order "m=2" and produces fragments having a length of 8 symbols, and a second erasure encoding scheme has an order "m=11" and produces fragments having a length of 11 symbols. Fragments produced by the first erasure decoding scheme are not of the proper length for decoding by the second erasure decoding scheme. Likewise, fragments produced by the second erasure decoding scheme are not of the proper length for decoding by the first erasure decoding scheme. To resolve this, padding characters (padding symbols), each being 2 symbols long (order=m=2), are added to each fragment produced by the first erasure encoding scheme until the total number of symbols is divisible by 11 and also still divisible by 2. In this example, that total number of symbols will be 22. Also, padding characters, each being 11 symbols long (order=m=11), are added to each fragment produced by the second erasure encoding scheme until the total number of symbols is divisible by 2 and also still divisible by 11. In this example, that total number of symbols will again be 22. Thus, the fragments have been expanded by adding padding symbols until the number of symbols in each fragment is the same and also is divisible by the original orders (2, 11). In other words, the fragments have been expanded by adding padding characters until the number of symbols in each fragment is at least the least common multiple (LCM) of the original orders, or an integer multiple of that least common multiple. Thus, in the example given, padding characters could be added until the length of each fragment is 22 symbols (LCM), 44 symbols (2×LCM), 66 symbols (3×LCM), etc. Such higher (2×, 3×, etc.) integer multiples, however, consume additional processing power, require additional processing time, and/or provide little or no benefit over using the LCM. The selected multiple of the LCM must be, however, at least the size of the largest original fragment.

As another example, assume that a first erasure encoding scheme having an order m=2 produces fragments having a length of 8 symbols, a second erasure encoding scheme having an order m=11 produces fragments having a length of 11 symbols, and a third erasure encoding scheme having an order m=4 produces fragments having a length of 4 symbols. The LCM would now be 44. This is the first length that is divisible by all of the original orders: 2, 4, and 11. So, padding characters would be added, two symbols at a time, until the fragments produced by the first erasure encoding scheme have a length of 44 symbols; padding characters would be added, 11 symbols at a time, until the fragments produced by the second erasure encoding scheme have a length of 44 symbols; and padding characters would be added, 4 symbols at a time, until the fragments produced by the third erasure encoding scheme have a length of 44 symbols. Thus, each fragment, regardless of the erasure coding scheme that produced it, would have a final length of 44 symbols, 44 being the first number which is divisible by 2, 4, and 11.

Consider now the situation where three different encoding schemes produced the fragments which have been recovered. For example, a first encoding scheme having an order m=4 has produced fragments (A) having a length of 4 symbols, a second encoding scheme having an order m=7 has produced fragments (B) having a length of 7 symbols, and a third encoding scheme having an order m=9 has produced fragments (C) having a length of 9 symbols. The LCM will be 252 (4×7×9). Thus, padding characters will be added to fragment A, 4 symbols at a time, until fragment A has a length of 252 symbols, padding characters will be added to fragment B, 7 symbols at a time, until fragment B has a length of 252 symbols, and padding characters will be added to fragment C, 9 symbols at a time, until fragment C has a length of 252 symbols.

Further, consider another situation where three different encoding schemes produced the fragments which have been recovered. For example, assume a first encoding scheme having an order m=4 has produced fragments (A) having a length of 4 symbols, a second encoding scheme having an order m=7 has produced fragments (B) having a length of 7 symbols, and a third encoding scheme having an order m=12 has produced fragments (C) having a length of 12 symbols; the LCM will therefore be 84. This number is the lowest number that is divisible by all of the original orders: 4, 7 and 12. Thus, padding characters will be added to fragment A, in one or more blocks of 4 symbols at a time, until fragment A has a length of 84 symbols, padding characters will be added to fragment B, in one or more blocks of 7 symbols at a time, until fragment B has a length of 84 symbols, and padding characters will be added, in one or more blocks of 12 symbols at a time, to fragment C until fragment C has a length of 84 symbols.

Although the above has been described in terms of adding padding, m symbols at a time, i.e., as adding blocks of m symbols as a time, this is merely one convenient way of doing so. For example, padding could be added to a fragment, 1 symbol at a time, until the length of that fragment is divisible by all of the original orders. Another convenient way is to determine the LCM, determine the difference between the original length of the fragment and the LCM, and then add that difference, in padding symbols, to the fragment. The net result of the padding operation is that all fragments have the same length, and that length is divisible by the original orders of the encoding schemes.

Thus, in general, the original orders of the fragments or the erasure encoding schemes is determined, the fragments are extended by padding symbols until all fragments have the same length, with that length being divisible by all of the original orders. An enhanced or expanded encoding matrix is generated, pruned, and inverted. The collected fragment matrix is then pruned in the same manner as the expanded encoding matrix, and the inverted matrix is applied to the pruned collected fragment matrix. The data may then be verified or the process may be repeated using different pruning. A high LCM, such as in the hundreds or greater, might occur in certain cases, such as where the order (n) values are large and not related as integer multiples, and might involve substantial computing power and time, but may allow recovery of an otherwise unrecoverable file. Also, the steps mentioned herein may performed in a different sequence than described. For example, the pruned encoding matrix may be generated first and then the padding performed.

Also, Reed-Solomon generator matrices are generally either (systematic) Vandermonde or (systematic) Cauchy matrices. In the case of systematic Cauchy matrices, choosing rows of each different generator matrix such that their numeric indices are distinct empirically increases the probability of finding a successful data recovery by hybrid decoding. This may also be true for Vandermonde or systematic Vandermonde matrices but has not yet been verified.

Figure 2A:
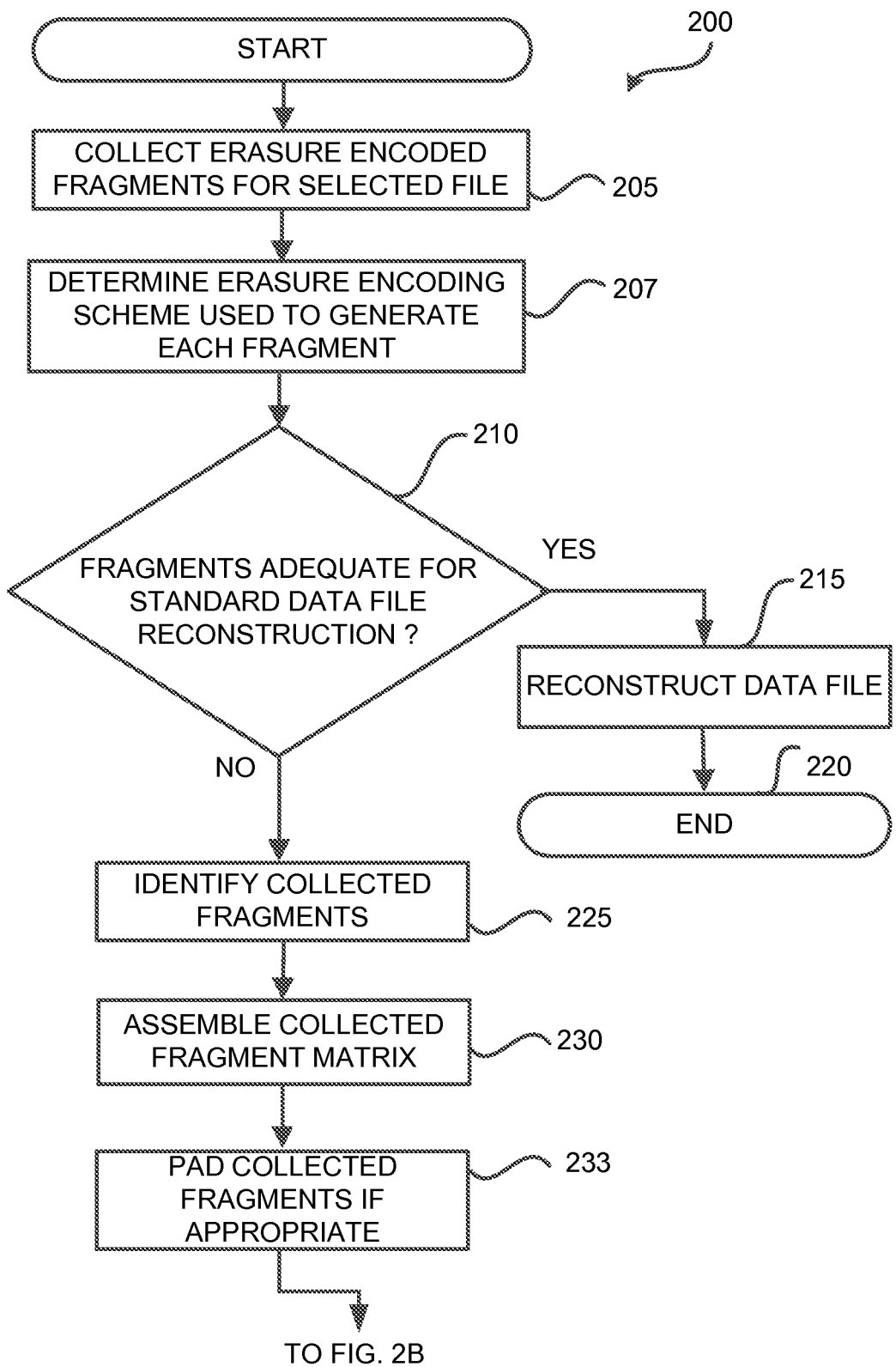
FIGS. 2A-2C are flow diagrams showing an illustrative routine performed by a client access server or other computing device to reconstruct a data file from erasure encoded fragments for that data file.
Figure 2B:
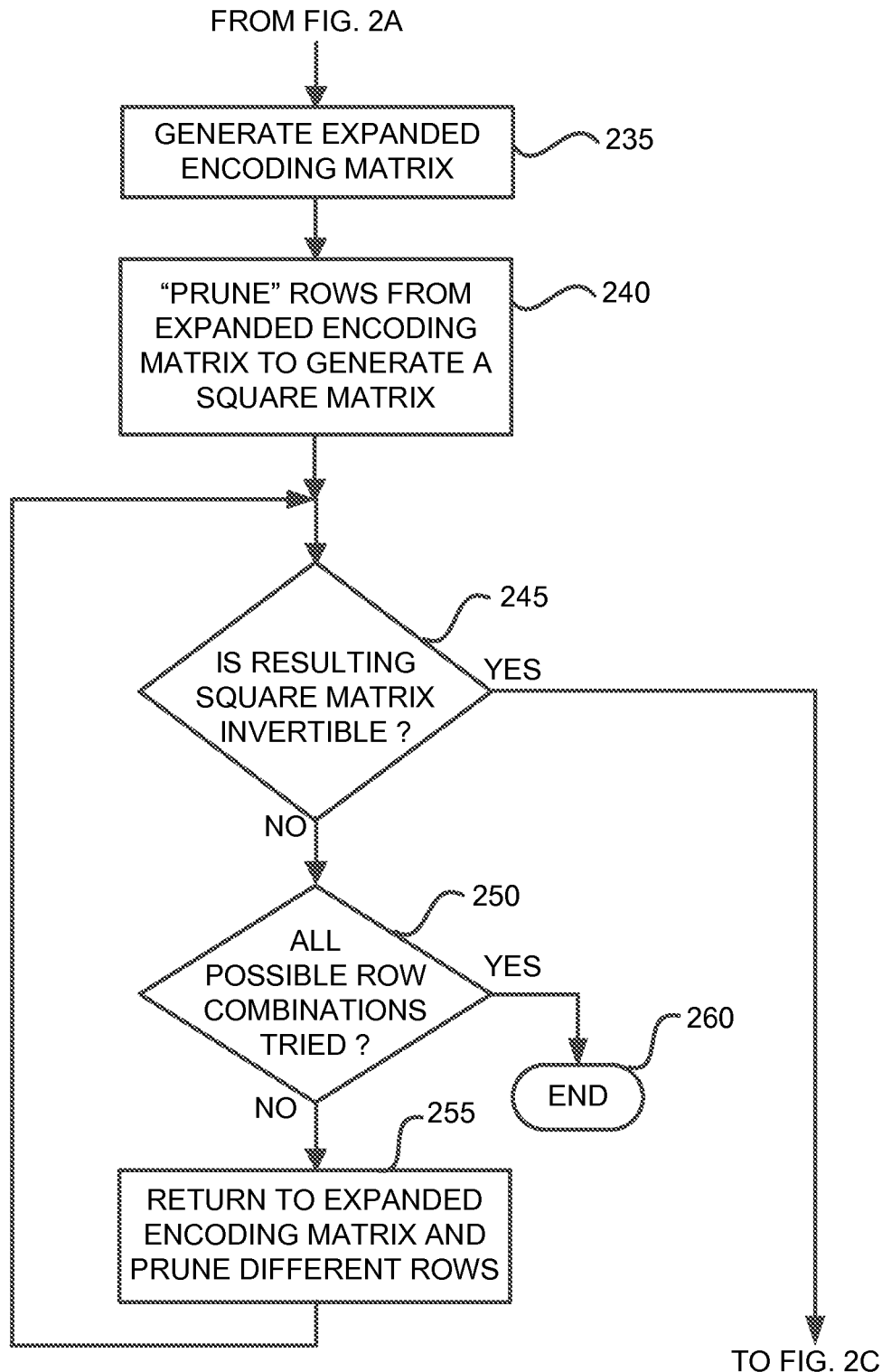
Figure 2C:
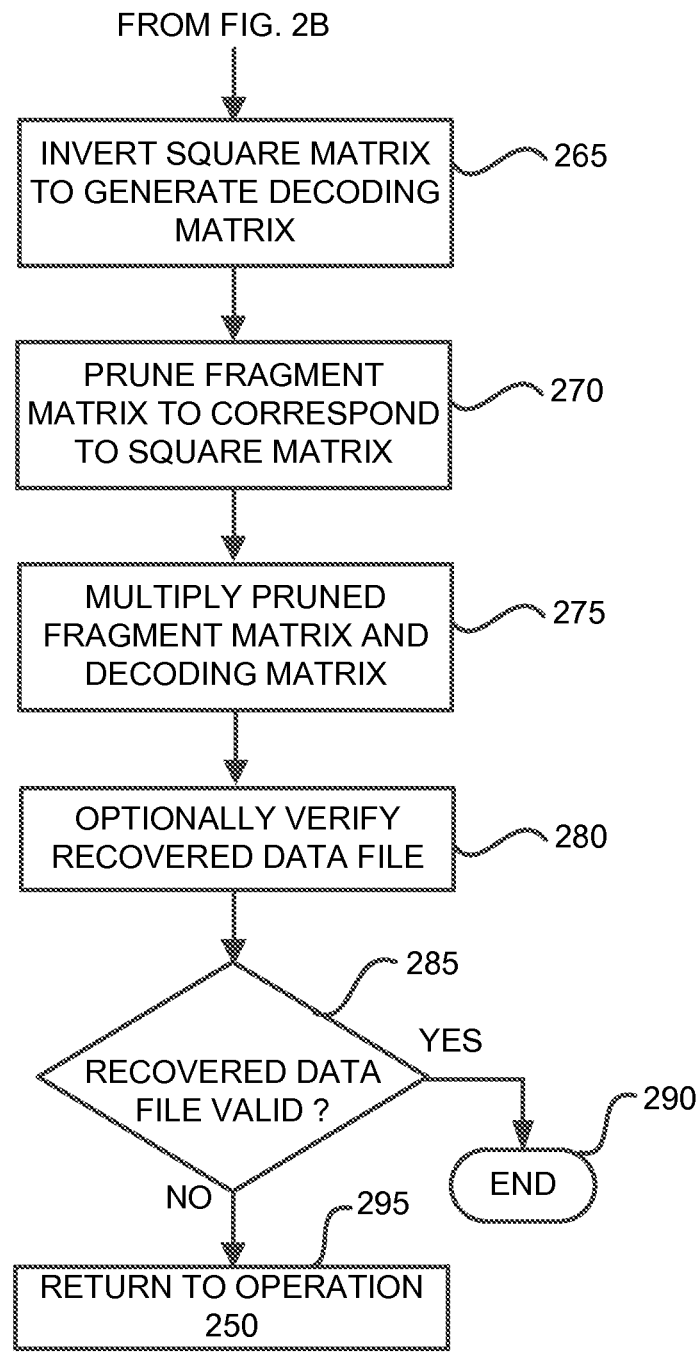

FIGS. 2A-2C are flow diagrams showing an illustrative routine 200 performed by a client access server 20 or other computing device to reconstruct a data file D from erasure encoded fragments for that data file. It should be appreciated that the logical operations described herein are implemented (1) as a sequence of computer implemented acts or program modules running on a computing system, (2) as interconnected machine logic circuits or circuit modules within the computing system, and/or (3) as one or ASICs. The implementation of the various components described herein is a matter of choice dependent on the performance and other requirements of the computing system. Accordingly, the logical operations described herein are referred to variously as operations, structural devices, acts, or modules. These operations, structural devices, acts, and modules may be implemented in software, in firmware, in special purpose digital logic, and any combination thereof. It should also be appreciated that more or fewer operations may be performed than shown in the figures and described herein. These operations may also be performed in parallel, or in a different order than those described herein.

The routine 200 begins at operation 205, where the client access server 20 collects (retrieves, requests) the erasure encoded fragments for a particular data file from the various servers 30. All fragments may be requested from all servers at once if desired, but this may unnecessarily increase network traffic, as only m fragments may be adequate to reconstruct the data file if all m fragments are valid and non-overlapping. Therefore, to conserve network resources, m fragments may be requested from a single server, all fragments from a select group of servers may be requested and then other fragments requested from other servers if necessary, some fragments from a select group of servers may be requested and then other fragments requested from other servers if necessary, a minimal number of fragments may be requested from a select group of servers, etc. Requesting only a minimal number of fragments at the beginning and then requesting one fragment at a time may reduce network traffic, but may also increase processing time. Therefore, there is a trade-off between the number of fragments requested each time, the consumption of network resources due to the network traffic, and the speed of the data reconstruction. At operation 207, the erasure encoding scheme, and the order m of the erasure encoding scheme, originally used to generate each fragment is determined. As previously mentioned, fragment, metadata associated with the fragment, or separately-stored data regarding the fragment, contains information regarding, or will specify, the particular erasure encoding scheme used, the order m of the scheme, and the length L of the fragment stored.

At operation 210, a determination is made as to whether the collected fragments are adequate for standard data file reconstruction; that is, whether there are enough erasure encoded fragments to permit reconstruction of the data file under any erasure encoding technique that was used. For example, have a sufficient number of valid fragments generated using at least one of the erasure encoding schemes been collected? If so, then the data file is reconstructed at operation 215, the reconstructed data file is sent to the requesting source, or other action taken, such as replacing lost or corrupted fragments on one or more servers, and then the operation ends at 220.

If, at operation 210, it is determined that there is not a sufficient number of collected valid fragments to permit reconstruction of the data file under any single erasure encoding scheme that was used then, at operation 225, the collected fragments are identified by the erasure encoding scheme and order (m=2, m=3, m=4, m=5, etc.) of the erasure encoding scheme and the fragment name or position ($C_0$, $C_1$, $C_{4,0,0}$, etc.). At operation 230, based upon this information, a collected fragment matrix CD is assembled. As mentioned, all fragments may be collected at once, or only some of the fragments may be initially collected. Thus, the collected fragment matrix may be partial or may be complete. At operation 233, each collected fragment matrix may be padded, if appropriate, as explained with respect to FIG. 3

At operation 235, an enhanced or expanded encoding matrix EEM, as described above, is then generated based upon the identification of the erasure encoding schemes used to generate the fragments which were collected. Alternatively, the expanded encoding matrix may be generated based upon the encoding schemes in use, and then pruned to correspond to the fragments actually collected. If duplicate fragments have not already been discarded then the expanded encoding matrix is inspected for duplicate rows, that is, two or more rows which are identical. If two identical rows are found, then one of them is discarded. If three identical rows are found, then two of them are discarded; and so on until there are no duplicate rows. Also, it does not matter which duplicate row is discarded. For example, the first appearance of a row may be discarded and the second appearance retained. Or, the first appearance may be retained and the second and subsequent appearances discarded.

After any duplicate row(s) has been discarded then, in operation 240, one or more rows from the expanded encoding matrix are selectively removed ("pruned") to generate a square matrix. The pruning may be performed in any desired or convenient manner to generate a square matrix. For example, the first row, the first two rows, the first and third rows, the last row, the first and last rows, two adjacent rows, etc.

At operation 245, the resulting square matrix is tested to determine whether it is an invertible matrix. If the resulting square matrix is not invertible then, at operation 250, a determination is made as to whether all possible row combinations have been tried. If all possible row combinations have not been tried, then, at operation 255, a return is made to the expanded encoding matrix, different row(s) are pruned, and then operation 245 is performed again.

At operation 250, if all possible row combinations have been tried, and an invertible square matrix was not produced, then the procedure is terminated at 260 and, optionally, a different recovery procedure may be attempted. At operation 245, if the resulting square matrix is invertible, then, at operation 265, the square matrix is inverted to produce a decoding matrix MD.

At operation 270, the fragment matrix is pruned to correspond to the square matrix. That is, duplicate row(s) are discarded, and the same row or rows in the fragment matrix are removed that were removed from the expanded encoding matrix. At operation 275, the pruned fragment matrix and the decoding matrix are multiplied to produce the recovered segments $D_0$, $D_1$, $D_2$, etc. of the data file.

Optionally, the recovered data file may be verified at operation 280. If, at operation 285, the recovered data file is valid then the procedure is terminated at operation 290. If the recovered data file is not valid then a return is made to operation 250 whereby, if all possible row combinations have not been tried, then different rows are pruned at operation 255 and another attempt is made to recover the data file. As indicated above, the sequence of steps is not critical. For example, steps 235-255 may be performed before steps 225-233.

Figure 3:
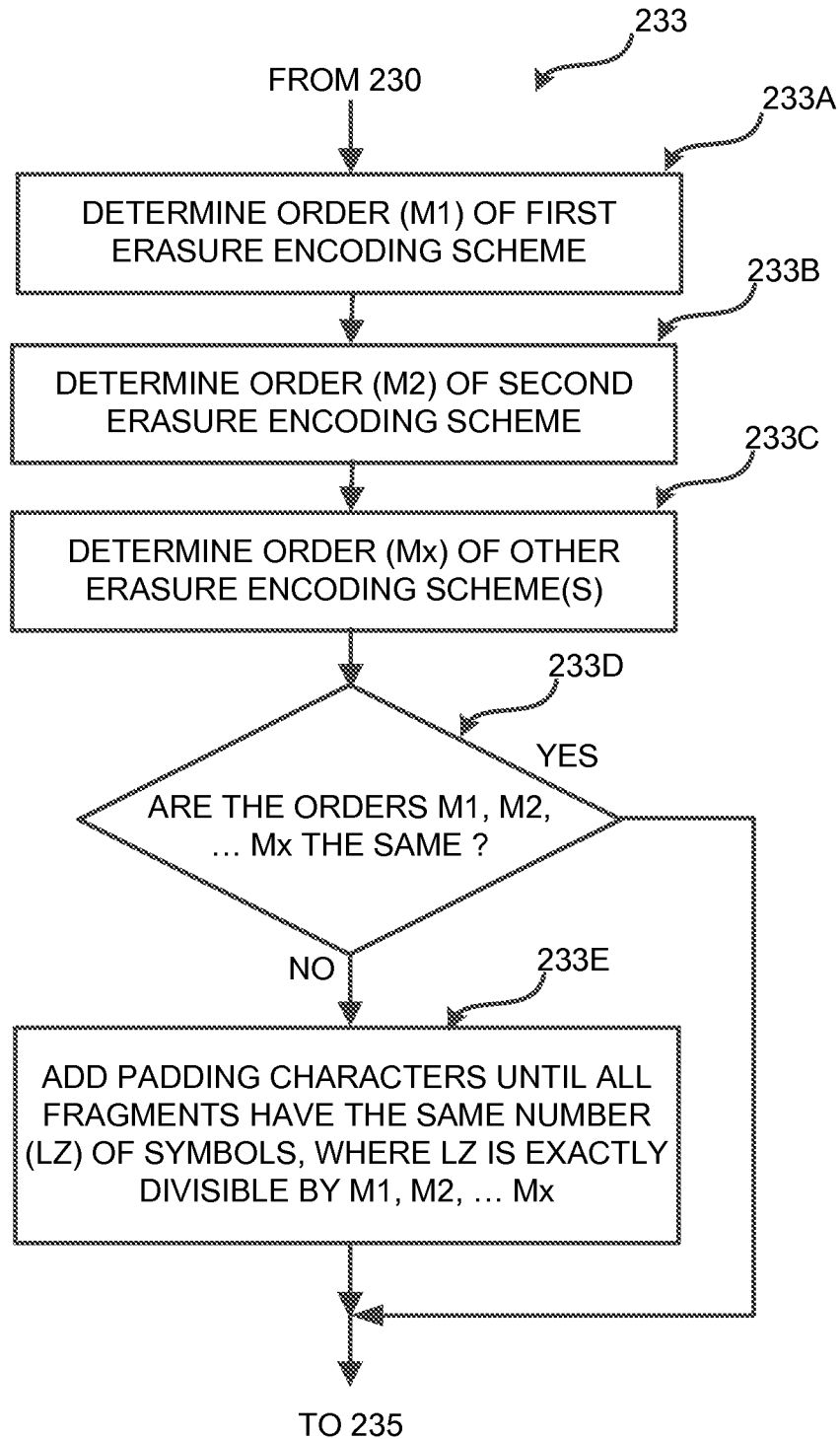
FIG. 3 illustrates padding of collected fragments.

FIG. 3 illustrates padding of the collected fragments. As discussed above, if the various fragments do not have the same length then the data fragments must be padded so that the resulting padded fragments are all of a length which will permit decoding by all of the particular encoding schemes used. This is accomplished by adding padding characters to each fragment until all fragments have the same length (number of symbols) and that length each exactly divisible by each of the orders. As previously mentioned, the order of a fragment is determined by the order of the erasing encoding scheme which generated the fragment.

Therefore, at operation 233A, the order (M1) for fragments produced by the first erasure encoding scheme is determined. Likewise, at operation 233B, the order (M2) of fragments produced by the second erasure encoding scheme is determined. If the fragments were created by more than two erasure encoding schemes then at operation 233C the order (Mx) of fragments produced by the other erasure encoding scheme(s) is determined. Operation 233D tests whether the order M1, M2, . . . Mx are the same. If they are the same then operation 235 is commenced. If they are not the same then padding characters are added at the ends of the collected fragments, as appropriate, until all fragments in all sets have the same number (LZ) of symbols, where LZ is at least the least common multiple of M1, M2, . . . Mx. LZ may be larger if desired, such as an integer multiple of the least common multiple of M1, M2, . . . Mx.

Figure 4:
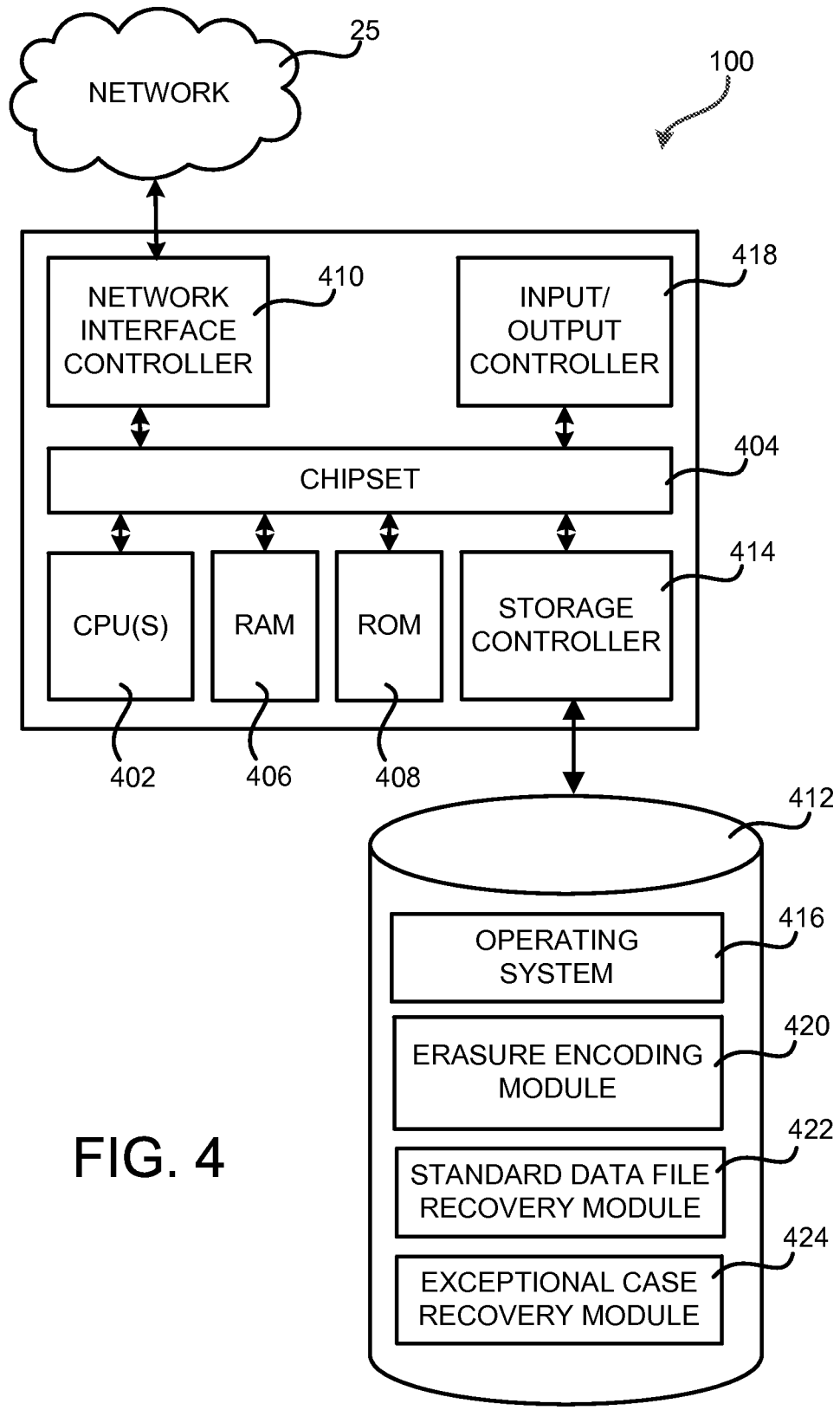
FIG. 4 is a computer architecture diagram showing exemplary computer architecture for a client access server or other computing device capable of performing the functionality disclosed herein for storing and recovering erasure encoded files.

FIG. 4 is a computer architecture diagram showing exemplary computer architecture for a client access server or other computing device capable of performing the functionality disclosed herein for storing and recovering erasure encoded files. The computer architecture shown illustrates a conventional server computer, workstation, desktop computer, laptop, network appliance, or other computing device, and may be utilized to execute any aspects of the software components presented herein described as executing within the computing device and/or other computing devices mentioned herein.

The computer 400 includes a baseboard, or "motherboard," which is a printed circuit board to which a multitude of components or devices may be connected by way of a system bus or other electrical communication paths. In one illustrative embodiment, one or more central processing units ("CPUs") 402 operate in conjunction with a chipset 404. The CPUs 402 are standard programmable processors that perform arithmetic and logical operations necessary for the operation of the computer 400.

The CPUs 402 perform the necessary operations by transitioning from one discrete, physical state to the next through the manipulation of switching elements that differentiate between and change these states. Switching elements may generally include electronic circuits that maintain one of two binary states, such as flip-flops and electronic circuits that provide an output state based on the logical combination of the states of one or more other switching elements, such as logic gates. These basic switching elements may be combined to create more complex logic circuits, including registers, adders-subtractors, arithmetic logic units, floating-point units and the like.

The chipset 404 provides an interface between the CPUs 402 and the remainder of the components and devices on the baseboard. The chipset 404 may provide an interface to a random access memory ("RAM") 406, used as the main memory in the computer 400. The chipset 404 may further provide an interface to a computer-readable storage medium such as a read-only memory ("ROM") 408 or non-volatile RAM ("NVRAM") for storing basic routines that that help to startup the computer 400 and to transfer information between the various components and devices. The ROM 408 or NVRAM may also store other software components necessary for the operation of the computer 400 in accordance with the embodiments described herein.

The computer 400 may operate in a networked environment using logical connections to remote computing devices and computer systems through the network 25. The chipset 404 may include functionality for providing network connectivity through a network interface controller ("NIC") 410, such as a gigabit Ethernet adapter. The NIC 410 is capable of connecting the computer 400 to other computing devices over the network 25. It should be appreciated that multiple NICs 410 may be present in the computer 400, connecting the computer to multiple communication channels, such as but not limited to communication channels in the network 25, other types of networks, and remote computer systems.

The computer 400 may be connected to a mass storage device 412 that provides non-volatile storage for the computer. The mass storage device 412 may store system programs, application programs, other program modules and data, which have been described in greater detail herein. The mass storage device 412 may be connected to the computer 400 through a storage controller 414 connected to the chipset 404. The mass storage device 412 may consist of one or more physical storage units. The storage controller 414 may interface with the physical storage units through a serial attached SCSI ("SAS") interface, a serial advanced technology attachment ("SATA") interface, a fiber channel ("FC") interface, or other type of interface for physically connecting and transferring data between computers and physical storage units.

The computer 400 may store data on the mass storage device 412 by transforming the physical state of the physical storage units to reflect the information being stored. The specific transformation of physical state may depend on various factors, in different implementations of this description. Examples of such factors may include, but are not limited to, the technology used to implement the physical storage units, whether the mass storage device 412 is characterized as primary or secondary storage and the like.

For example, the computer 400 may store information to the mass storage device 412 by issuing instructions through the storage controller 414 to alter the magnetic characteristics of a particular location within a magnetic disk drive unit, the reflective or refractive characteristics of a particular location in an optical storage unit, or the electrical characteristics of a particular capacitor, transistor, or other discrete component in a solid-state storage unit. Other transformations of physical media are possible without departing from the scope and spirit of the present description, with the foregoing examples provided only to facilitate this description. The computer 400 may further read information from the mass storage device 412 by detecting the physical states or characteristics of one or more particular locations within the physical storage units.

In addition to the mass storage device 412 described above, the computer 400 may have access to other computer-readable storage medium to store and retrieve information, such as program modules, data structures, or other data. It should be appreciated by those skilled in the art that computer-readable storage media can be any available media that provides for the storage of non-transitory data and that may be accessed by the computer 400. The term computer-storage media as used herein, however, does not encompass propagated signals per se.

By way of example, and not limitation, computer-readable storage media may include volatile and non-volatile, removable and non-removable media implemented in any method or technology. Computer-readable storage media includes, but is not limited to, RAM, ROM, erasable programmable ROM ("EPROM"), electrically-erasable programmable ROM ("EEPROM"), flash memory or other solid-state memory technology, compact disc ROM ("CD-ROM"), digital versatile disk ("DVD"), high definition DVD ("HD-DVD"), BLU-RAY, or other optical storage, magnetic cassettes, magnetic tape, magnetic disk storage or other magnetic storage devices, or any other medium that can be used to store the desired information in a non-transitory fashion. For purposes of the claims, the phrases "computer storage medium" and "computer-readable storage medium", and variations thereof, do not include waves, signals, and/or other transitory and/or intangible communication media, per se.

The mass storage device 412 may store an operating system 416 utilized to control the operation of the computer 400. According to one embodiment, the operating system includes a member of the LINUX family of operating systems. According to another embodiment, the operating system includes a member of the WINDOWS® SERVER family of operating systems from MICROSOFT Corporation in Redmond, Wash. According to further embodiments, the operating system may include a member of the UNIX or SOLARIS families of operating systems. It should be appreciated that other operating systems may also be utilized. The mass storage device 412 may store other system or application programs, modules, and/or data utilized by the computer 400 such as: an erasure encoding module 420 that erasure encodes a data file to provide erasure encoded fragments for storage on the various servers 30A-30N; a standard data file recovery module 422 for reconstructing a data file when sufficient erasure encoded fragments are immediately available to permit reconstruction of the data file; and/or an exceptional case recovery module 424 to attempt reconstruction of a data file when there are insufficient fragments under any erasure encoding scheme to permit reconstruction of the data file using standard reconstruction techniques.

In one embodiment, the mass storage device 412 or other computer-readable storage media is encoded with computer-executable instructions that, when loaded into the computer 400, transform the computer from a general-purpose computing system into a special-purpose computer capable of implementing the embodiments described herein. These computer-executable instructions transform the computer 400 by specifying how the CPUs 402 transition between states, as described above. According to one embodiment, the computer 400 has access to computer-readable storage media storing computer-executable instructions which, when executed by the computer 400, perform aspects of one or more of the methods or procedures described herein.

The computer 400 may also include an input/output controller 418 for receiving and processing input from a number of input devices, such as a keyboard, a mouse, a touchpad, a touch screen, an electronic stylus, or other type of input device. Similarly, the input/output controller 418 may provide output to a display, such as a computer monitor, a flat-panel display, a digital projector, a printer, a plotter, or other type of output device. It will be appreciated that the computer 400 may not include all of the components shown herein, may include other components that are not explicitly shown herein, or may utilize an architecture completely different than that shown herein.

Although the exemplary computer architecture shown and discussed herein is directed to the client access server 20, this general architecture is also suited for the storage servers 30 and the client computer 10, the primary difference being the use of different modules or programs in the mass storage device 412 so as to provide for implementation of the different functions performed by the particular device. Further, although computer implementation is preferred, implementation may also be by one or application specific integrated circuits (ASICs).

Although the operation and implementation have been described herein in terms of matrices and matrix operations, that is for convenience of illustration and discussion and other forms of operation and implementation may be used, such as but not limited to spreadsheets and data manipulation modules. Based on the foregoing, it should be appreciated that technologies for reconstruction of encoded data files, such as erasure encoded data files, have been disclosed herein and that it may be possible to reconstruct a data file using fragments produced by different erasure encoding schemes. Although the subject matter presented herein has been described in language specific to systems, methodological acts, and processes, it is to be understood that the concepts disclosed herein are not necessarily limited to the specific features, acts, or media described herein. Rather, the specific features, acts and mediums are disclosed as example forms.

The subject matter described herein is provided by way of illustration for the purposes of teaching, suggesting, and describing, and not limiting or restricting. Combinations and alternatives to the illustrated embodiments are contemplated, described herein, and set forth in the claims. Various modifications and changes may be made to the subject matter described herein without strictly following the embodiments and applications illustrated and described, and without departing from the scope of the following claims.

The invention claimed is:

1. A computer-readable storage medium having computer-executable instructions stored thereupon for recovering a data file from a plurality of erasure encoded fragments generated by a plurality of erasure encoding schemes operating on the data file, and the instructions, when executed by a computer, cause the computer to:
   collect at least some of the erasure encoded fragments for the data file to provide collected erasure encoded fragments;
   identify the erasure encoding schemes of the plurality of erasure encoding schemes used to produce the collected erasure encoded fragments;
   identify a fragment position of each erasure encoded fragment of the collected erasure encoded fragments;
   generate a collected fragment matrix of the collected erasure encoded fragments based upon at least one of the identified erasure encoding scheme of each erasure encoded fragment or the fragment position of each erasure encoded fragment;
   determine a first order for a first identified erasure encoding scheme of the plurality of erasure encoding schemes;
   determine a second order for a second identified erasure encoding scheme of the plurality of erasure encoding schemes;
   if the first order is different than the second order then add one or more padding symbols to at least one of the collected erasure encoded fragments of the first identified erasure encoding scheme or the collected erasure encoded fragments of the second identified erasure encoding scheme so both the collected erasure encoded fragments of the first identified erasure encoding scheme and the collected erasure encoded fragments of the second identified erasure encoding scheme have a same number of symbols, the number of symbols being divisible by both the first order and the second order;
   generate an expanded encoding matrix based upon the identified erasure encoding schemes;
   remove one or more rows from the expanded encoding matrix to generate a square matrix;
   determine whether the square matrix is invertible;
   if the square matrix is invertible then:
      remove one or more corresponding rows from the collected fragment matrix to provide a reduced collected fragment matrix;
      invert the square matrix to provide a decoding matrix; and
      multiply the decoding matrix and the reduced collected fragment matrix to recover the data file;
   if the square matrix is not invertible then remove one or more different rows from the expanded encoding matrix to generate a different square matrix;
   if the different square matrix is invertible then:
      remove one or more corresponding rows from the collected fragment matrix to provide a different reduced collected fragment matrix;
      invert the different square matrix to provide a different decoding matrix; and
      multiply the different decoding matrix and the different reduced collected fragment matrix to recover the data file.

2. The computer-readable storage medium of claim 1 wherein the computer-executable instructions stored thereupon, when at least one of the collected erasure encoded fragments is produced by a third identified erasure encoding scheme of the plurality of erasure encoding schemes, further cause the computer to:
   determine a third order for the third identified erasure encoding scheme;
   add the one or more padding symbols to at least some of the collected erasure encoded fragments so the collected erasure encoded fragments of the first identified erasure encoding scheme, the collected erasure encoded fragments of the second identified erasure encoding scheme, and the collected erasure encoded fragments of the third identified erasure encoding scheme have a same number of symbols, the number of symbols being divisible by the first order, the second order, and the third order.

3. The computer-readable storage medium of claim 2 wherein the padding symbols are added to at least one collected erasure encoded fragment as one or more blocks of symbols, a block having a number of symbols corresponding to the order of the erasure encoding scheme which generated the at least one collected erasure encoded fragment.

4. A method for recovering a data file from a plurality of original erasure encoded fragments generated by a plurality of erasure encoding schemes operating on the data file, the method comprising:

collecting at least some of the erasure encoded fragments for the data file to provide collected erasure encoded fragments;

identifying the erasure encoding schemes of the plurality of erasure encoding schemes used to produce the collected erasure encoded fragments;

generating a collected fragment matrix of the collected erasure encoded fragments;

generating an expanded encoding matrix based upon the identified erasure encoding schemes;

if the expanded encoding matrix is a square matrix which is invertible then:
   inverting the square matrix to provide a decoding matrix; and
   multiplying the decoding matrix and the collected fragment matrix to recover the data file.

5. The method of claim 4, and further comprising:

if the expanded encoding matrix is not a square matrix then removing one or more rows from the expanded encoding matrix to generate a square matrix;

determining whether the square matrix is invertible;

if the square matrix is invertible then:
   inverting the square matrix to provide a decoding matrix;
   removing one or more corresponding rows from the collected fragment matrix to provide a reduced collected fragment matrix; and
   multiplying the decoding matrix and the reduced collected fragment matrix to recover the data file;

if the square matrix is not invertible then removing one or more different rows from the expanded encoding matrix to generate a different square matrix;

if the different square matrix is invertible then:
   inverting the different square matrix to provide a different decoding matrix;
   removing one or more corresponding rows from the collected fragment matrix to provide a different reduced collected fragment matrix; and
   multiplying the different decoding matrix and the different reduced collected fragment matrix to recover the data file.

6. The method of claim 4 and, prior to generating the collected fragment matrix, further comprising:
   identifying at least one characteristic of the collected erasure encoded fragments; and
   generating the collected fragment matrix based upon the at least one characteristic of the collected erasure encoded fragments.

7. The method of claim 4 and, prior to generating the collected fragment matrix, further comprising:
   identifying a fragment position of each erasure encoded fragment of the collected erasure encoded fragments; and
   generating the collected fragment matrix based upon the identified erasure encoding scheme of each erasure encoded fragment and the fragment position of each erasure encoded fragment.

8. The method of claim 4 and, as part of generating the collected fragment matrix, further comprising:
   determining a first order for a first identified erasure encoding scheme of the plurality of erasure encoding schemes;
   determining a second order for a second identified erasure encoding scheme of the plurality of erasure encoding schemes;
   if the first order is different than the second order then adding padding symbols to the collected erasure encoded fragments of at least one of the first identified erasure encoding scheme or the second identified erasure encoding scheme so the collected erasure encoded fragments of both the first identified erasure encoding scheme and the collected erasure encoded fragments of the second identified erasure encoding scheme have a same number of symbols, the number of symbols being divisible by both the first order and the second order.

9. The method of claim 8 wherein the padding symbols are added to at least one collected erasure encoded fragment as one or more blocks of symbols, a block having a number of symbols corresponding to the order of the erasure encoding scheme which generated the at least one collected erasure encoded fragment.

10. The method of claim 8 wherein the number of symbols is at least the least common multiple of the first order and the second order.

11. The method of claim 4 and, prior to generating a collected fragment matrix of the collected erasure encoded fragments, further comprising:
   identifying erasure encoded fragments which are produced by one of the identified erasure encoding schemes;
   determining whether the identified fragments produced by the one of the identified erasure encoding schemes are adequate to reconstruct the data file using a decoding scheme corresponding to the one of the identified erasure encoding schemes;
   if the identified fragments produced by the one of the identified erasure encoding schemes are adequate then reconstructing the data file using the identified fragments and the corresponding decoding scheme.

12. The computer-implemented method of claim 4 wherein the erasure-encoded fragments have been produced by three different erasure encoding schemes of the plurality of erasure encoding schemes and, as part of generating the collected fragment matrix, further comprising:
   determining a first order for a first identified erasure encoding scheme of the plurality of erasure encoding schemes;
   determining a second order for a second identified erasure encoding scheme of the plurality of erasure encoding schemes;
   determining a third order for a third identified erasure encoding scheme of the plurality of erasure encoding schemes;
   adding one or more padding symbols to at least some of the collected erasure encoded fragments so the collected erasure encoded fragments of the first identified erasure encoding scheme, the collected erasure encoded fragments of the second identified erasure encoding scheme, and the collected erasure encoded fragments of the third identified erasure encoding scheme have a same number of symbols, the number being divisible by the first order, the second order, and the third order.

13. A system to recover a data file from a plurality of original erasure encoded fragments generated by a plurality of erasure encoding schemes operating on the data file, the system comprising a computer, the computer comprising:
   a memory device containing operating instructions and files;
   a network interface device for sending and receiving data over a network;
   a processor, communicatively coupled to the memory device and to a communications link, the processor executing the operating instructions to:

collect at least some of the erasure encoded fragments for the data file to provide collected fragments;

identify the erasure encoding schemes of the plurality of erasure encoding schemes used to produce the collected erasure encoded fragments;

generate a collected fragment matrix of the collected erasure encoded fragments;

generate an expanded encoding matrix based upon the identified erasure encoding schemes;

if the expanded encoding matrix is a square matrix which is invertible then:

invert the square matrix to provide a decoding matrix; and multiply the decoding matrix and the collected fragment matrix to recover the data file.

14. The system of claim 13, wherein the memory device has further computer-executable instructions stored thereupon which, when executed by the computer, cause the computer to:

if the expanded encoding matrix is not a square matrix, remove one or more rows from the expanded encoding matrix to generate a square matrix;

determine whether the square matrix is invertible;

if the square matrix is invertible then:

invert the square matrix to provide a decoding matrix;

remove one or more corresponding rows from the collected fragment matrix to provide a reduced collected fragment matrix; and multiply the decoding matrix and the reduced collected fragment matrix to recover the data file;

if the square matrix is not invertible then to remove one or more different rows from the expanded encoding matrix to generate a different square matrix;

if the different square matrix is invertible then:

invert the different square matrix to provide a different decoding matrix;

remove one or more corresponding rows from the collected fragment matrix to provide a different reduced collected fragment matrix; and multiply the different decoding matrix and the different reduced collected fragment matrix to recover the data file.

15. The system of claim 13, wherein the memory device has further computer-executable instructions stored thereupon which, when executed by the computer, cause the computer, prior to generating the collected fragment matrix, to:

identify at least one characteristic of the collected erasure encoded fragments; and generate the collected fragment matrix based upon the at least one characteristic of the collected erasure encoded fragments.

16. The system of claim 13, wherein the memory device has further computer-executable instructions stored thereupon which, when executed by the computer, cause the computer, prior to generating the collected fragment matrix, to:

identify a fragment position of each erasure encoded fragment of the collected erasure encoded fragments; and generate the collected fragment matrix based upon the identified erasure encoding scheme of each erasure encoded fragment and the fragment position of each erasure encoded fragment.

17. The system of claim 13, wherein the memory device has further computer-executable instructions stored thereupon which, when executed by the computer, cause the computer, as part of generating the collected fragment matrix, to:

determine a first order for a first identified erasure encoding scheme of the plurality of erasure encoding schemes;

determine a second order for a second identified erasure encoding scheme of the plurality of erasure encoding schemes;

if the first order is different than the second order, to add padding symbols the collected erasure encoded fragments of at least one of the first identified erasure encoding scheme or to the collected erasure encoded fragments of the second identified erasure encoding scheme so the collected erasure encoded fragments of both the first identified erasure encoding scheme and the collected erasure encoded fragments of the second identified erasure encoding scheme have a same number of symbols, the number of symbols being divisible by both the first order and the second order.

18. The system of claim 13, wherein the memory device has further computer-executable instructions stored thereupon which, when executed by the computer, cause the computer, prior to generating a collected fragment matrix of the collected erasure encoded fragments, to:

identify fragments which are produced by one of the identified erasure encoding schemes;

determine whether the identified fragments produced by the one of the identified erasure encoding schemes are adequate to reconstruct the data file using a decoding scheme corresponding to the one of the identified erasure encoding schemes;

if the identified fragments produced by the one of the identified erasure encoding schemes are adequate then reconstruct the data file using the identified fragments and the corresponding decoding scheme.

19. The system of claim 13, wherein the collected erasure encoded fragments have been produced by a plurality of different erasure encoding schemes of the plurality of erasure encoding schemes, at least two of the erasure encoding schemes having an order different from each other, and wherein the memory device has further computer-executable instructions stored thereupon which, when executed by the computer, cause the computer, as part of generating a collected fragment matrix of the collected erasure encoded fragments, to:

identify an order of each identified erasure encoding scheme;

add one or more padding symbols to at least some of the collected erasure encoded fragments so the collected erasure encoded fragments have a same number of symbols, the number being divisible by each identified order.

20. The system of claim 19 wherein the padding symbols are added to at least one collected erasure encoded fragment of the collected erasure encoded fragments as one or more blocks of symbols, a block having a number of symbols corresponding to the order of the erasure encoding scheme which generated the at least one erasure-encoded fragment.

21. The system of claim 19 wherein the number of symbols is at least the least common multiple of the identified orders.

* * * * *